United States Patent [19]

Tei

[11] Patent Number: 4,973,537

[45] Date of Patent: Nov. 27, 1990

[54] PHOTOCONDUCTIVE ELEMENT

[75] Inventor: Sadahiro Tei, Kanagawa, Japan

[73] Assignee: Fuji Photo Film Co., Ltd., Kanagawa, Japan

[21] Appl. No.: 361,698

[22] Filed: Jun. 1, 1989

Related U.S. Application Data

[63] Continuation of Ser. No. 946,629, Dec. 29, 1986, abandoned, which is a continuation of Ser. No. 734,226, May 15, 1985, abandoned.

[30] Foreign Application Priority Data

May 15, 1984 [JP] Japan .................................. 59-95533

[51] Int. Cl.$^5$ .............................................. G03G 5/10
[52] U.S. Cl. ........................................ 430/67; 430/84
[58] Field of Search .............................. 430/67, 66, 84; 250/578

[56] References Cited

U.S. PATENT DOCUMENTS

| | | | |
|---|---|---|---|
| 3,092,493 | 6/1963 | Kaiser | 430/67 |
| 3,700,437 | 10/1972 | Eastler | 430/67 |
| 4,181,526 | 1/1980 | Blakey et al. | 430/67 |
| 4,546,243 | 10/1985 | Hamano et al. | 250/578 |

Primary Examiner—John L. Goodrow
Attorney, Agent, or Firm—Sughrue, Mion, Zinn, MacPeak & Seas

[57] ABSTRACT

A photoconductive element is described, comprising an amorphous silicon sensor and a transparent, insulative protective layer on the sensor, said protective layer comprising polymers or copolymers (including terpolymers, etc.) having one of four specific types of recurring units, or mixtures thereof, or polymer compositions composed mainly of the above polymers or copolymers; such a photoconductive element shows reduced damage of the sensor as compared to the conventional technique, and permits increases in productivity and decreases in production costs.

16 Claims, 1 Drawing Sheet

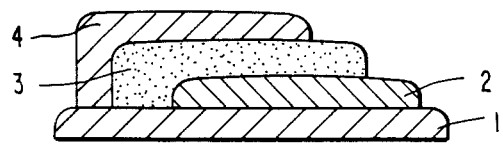
FIG. 1
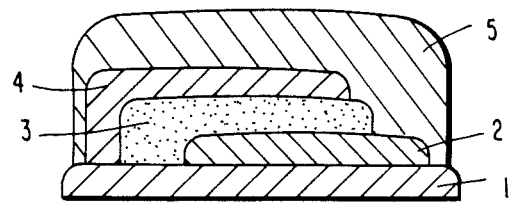
FIG. 2
FIG. 3
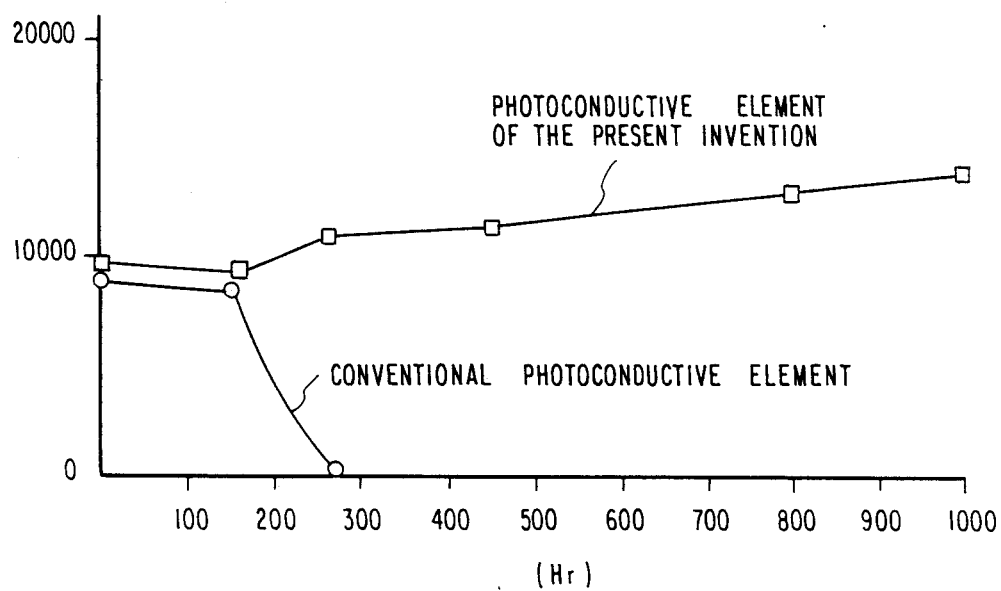

PHOTOCONDUCTIVE ELEMENT

This is a continuation of Ser. No. 06/946,629, filed 12/29/86, now abandoned, which is a continuation of Ser. No. 734,226, filed 5/15/85, now abandoned.

FIELD OF THE INVENTION

The present invention relates to a photoconductive element. More particularly, it is concerned with an amorphous silicon sensor with a protective layer provided thereon.

BACKGROUND OF THE INVENTION

Conventional Schottky-type photoconductive elements comprise, as illustrated in FIG. 1 (not to scale), a glass substrate 1, a metallic electrode 2, an amorphous silicon film 3, and a transparent electrode 4. When used in air, however, they suffer from a disadvantage in that the durability (service life) is deteriorated. Thus, to protect the sensor surface from dust, for example, in air, or against humidity, a film of $SiO_x$ or $Si_3N_4$ has conventionally been provided by a plasma CVD (chemical vapor deposition) method as a passivative film (a transparent, insulative protective film). When, however, such a film is provided by a plasma CVD method, the transparent electrode on the sensor surface is often damaged. For this reason, it has been desired to develop a film which can be used in place of the $SiO_x$ or $Si_3N_4$ film.

SUMMARY OF THE INVENTION

The present invention is intended to overcome the above-described defects of film formed by a plasma CVD method and an object of the present invention is to provide an amorphous silicon sensor with a transparent, insulative organic polymer protective film which provides reduced damage of the sensor involved in providing the protective film, and which permits increases in productivity and decreases in production costs.

It has been found that this object is attained by applying a transparent, insulative protective layer comprising specific polymers as described hereinafter.

Thus, the present invention relates to a photoconductive element comprising an amorphous silicon sensor and a transparent, insulative protective layer provided on the sensor, wherein the transparent, insulative protective layer comprises polymers or copolymers (including terpolymers, etc.) having a recurring unit represented by formula (1), (2), (3), or (4) as shown below, or mixtures thereof, or preferably a polymer composition composed mainly of said polymers or copolymers. Formulae (1), (2), (3), and (4) are as follows,

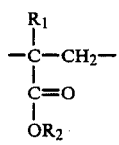
(1)

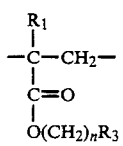
(2)

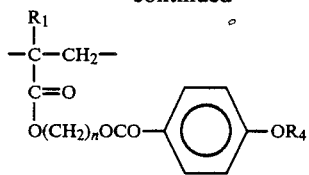
(3)

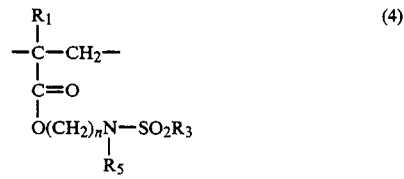
(4)

wherein $R_1$ represents a hydrogen atom or a methyl group;

$R_2$ represents a hydrocarbon residue having from 1 to 8 carbon atoms;

$R_3$ represents a hydrocarbon residue having from 3 to 21 carbon atoms;

$R_4$ represents a perfluoroalkyl group having from 3 to 21 carbon atoms;

$R_5$ represents a hydrogen atom or a hydrocarbon residue having from 1 to 10 carbon atoms; and n is an integer of from 1 to 10, provided that the above recurring units (1) to (4) may be substituted by a halogen atom.

BRIEF DESCRIPTION OF THE DRAWINGS

FIG. 1 is a cross-sectional view of a conventional photoconductive element with no protective film;

FIG. 2 is a cross-sectional view of a photoconductive element of the present invention; and FIG. 3 is a graph showing changes over time in the light/darkness ratios of a conventional photoconductive element and a photoconductive element of the present invention under conditions of 60° C. and 90% R.H. (relative humidity).

In FIGS. 1 to 2, 1 is a glass substrate, 2 is a metallic electrode layer, 3 is an amorphous silicon film, 4 is a transparent electrode layer, and 5 is a resin coating layer.

DETAILED DESCRIPTION OF THE INVENTION

The transparent, insulative protective layer comprises polymers or copolymers (including terpolymers, etc.) having a recurring unit represented by formula (1), (2), (3), or (4), or mixtures thereof, or preferably a polymer composition composed mainly of said polymers or copolymers. Other polymers which can be used in preparation of the above polymer compositions include polyvinyl alcohol, a phenol resin, a chloroprene rubber, a butyral resin, a formal resin, a melamine resin, a ketone resin, and a silicone resin.

In formula (1), the hydrocarbon residue having from 1 to 8 carbon atoms for $R_2$ is a linear or branched chain alkyl group or a group containing therein an ethylenically unsaturated double bond or bonds such as a methyl group, an ethyl group, an n-propyl group, an isopropyl group, etc.

In formula (2), the hydrocarbon residue having from 3 to 21 carbon atoms for $R_3$ is a linear or branched chain alkyl group or a group containing therein an ethylenically unsaturated double bond or bonds, such as an n-propyl group, an isopropyl group, an n-butyl group, an n-hexyl group, etc.

In formula (4), the hydrocarbon residue having from 1 to 10 carbon atoms for $R_5$ is a linear or branched chain alkyl group or a group containing therein an ethylenically unsaturated double bond or bonds, such as a methyl group, an ethyl group, an n-propyl group, an isopropyl group, etc.

In formulae (1), (2), (3), and (4), the hydrogen atom of $R_1$ or $R_5$ or a part or whole of the hydrogen atoms in the methyl group, hydrocarbon residue or perfluoroalkyl group for $R_1$, $R_2$, $R_3$, $R_4$, and $R_5$ may be substituted by a halogen atom such as a fluorine atom.

Referring to FIG. 2, a cross section of a photoconductive element of the present invention is shown. On a glass substrate 1 is provided a metallic electrode 2 of, e.g., Au, Ni, Ni-Cr, Cr, Al, or Ta at temperatures ranging between 100° and 300° C. by techniques such as vacuum deposition and a sputtering process. An amorphous silicon film (a-Si film) 3 is provided on the metallic electrode 2 at a substrate temperature of from 150° to 300° C. and then a transparent electrode 4 (composed of, e.g., indium tin oxide (ITO), indium oxide ($In_2O_3$), and tin oxide ($SnO_2$)) is provided thereon, thereby producing an a-Si sensor. Thereafter, a transparent resin solution as described above is coated on the surface of the a-Si sensor at the side which is exposed to light, thereby forming a resin coating layer 5.

To form the resin coating layer 5, the above-described polymer is dissolved in a solvent along with a hardening agent (a cross-linking agent), and the resulting solution is coated in a thickness of from 1 to 100 $\mu$m by a conventional procedure such as the spin quarter method, the roll quater method, and the spray method and then hardened by irradiating with ultraviolet light or by heating.

Solvents which can be used in preparation of the above coating solution include aromatic hydrocarbons (e.g., benzene, toluene, and xylene), trichlene, acetone, and commercial gasolines. The solids content of the coating solution is most appropriately from about 5 to 50% by weight.

Hardening agents commonly used can be employed in the present invention, including benzyl dimethyl ketal and benzoin ether-based compounds.

The photoconductive element of the present invention has various advantages over the conventional photoconductive elements. For example, the transparent, insulative protective layer of the present invention does not cause any damage to the sensor as involved in forming a protective film by the conventional plasma CVD method, is very convenient to produce, and further permits great reduction in the production costs.

The present invention is described in greater detail with reference to the following example.

EXAMPLE

An Ni-Cr layer was formed on a glass substrate in a thickness of 1,000 to 3,000 Å at a temperature of 250° C. by sputtering, and an a-Si layer was provided on the Ni-Cr layer in a thickness of 0.5 to 2 $\mu$m while maintaining the temperature of the substrate at 200° C. On the a-Si layer was further provided an ITO layer in a thickness of 100 to 2,000 Å as a transparent electrode by sputtering, to thereby produce a photo sensor.

In the above, the sputtering was carried out under the conditions that a mixture of 90 mol % $In_2O_3$ and 10 mol % $SnO_2$ was a target, the oxygen partial pressure was 0.5 to $1.5 \times 10^{-4}$ Torr, the argon partial pressure was $4 \times 10^{-3}$ Torr, the electrical power density was 100 to 1,000 mW/cm², and the substrate temperature was 50° C.

An ultraviolet-curable acrylic resin solution (Biscoat UV series produced by Osaka Yuki Kagaku Co., Ltd., or Aronix UV 3000 series produced by Toa Gosei Co., Ltd.) was coated on the photo sensor in a thickness of 10 $\mu$m by means of a roll coater and then hardened by passing it at a distance of 10 cm under a 80 W/cm ultraviolet generator for about 10 seconds, to thereby form a protective layer.

The thus-produced photoconductive element, when kept for 1,000 hours under conditions of a temperature of 85° C. and an R.H. of 85%, retained a light/darkness ratio of $10^4$. Even when the element was placed under conditions of a temperature of 60° C. and an R.H. of 90% for 1,000 hours, it also had a light/darkness ratio of $10^4$ (see FIG. 3).

On the other hand, when a conventional photoconductive element with no protective layer was placed under conditions of a temperature of 85° C. and an R.H. of 85%, its light/darkness ratio became impossible to measure in 100 hours, i.e., it was less than 100, and when it was placed under conditions of a temperature of 60° C. and an R.H. of 90%, the light/darkness raio became impossible to measure in 200 hours (see FIG. 3).

As can be seen from the above explanation, the present invention provides a photoconductive element comprising an amorphous silicon sensor and a transparent, insulative protective layer on the sensor, said layer being the above-specified acrylate-based polymers, and provides for reduction of damage to the sensor as compared to the case of conventional photoconductive elements, to permit increases in productivity and decreases in production cost.

While the invention has ben described in detail and with reference to specific embodiments thereof, it will be apparent to one skilled in the art that various changes and modifications can be made therein without departing from the spirit and scope thereof.

What is claimed is:

1. A photoconductive element comprising an amorphous silicon sensor capable of reading an image, comprising a glass substrate having provided thereon, in sequence, a metallic electrode, an amorphous silicon film and a transparent electrode, and a transparent, insulative protective layer on the sensor which covers the external area from the glass substrate over the sequence of the metallic electrode, the amorphous silicon film and the transparent electrode as well as connecting portions therebetween, wherein the transparent, insulative protective layer comprises a polymer or copolymer having a recurring unit or a mixture of units represented by formula (1), (2), (3) or (4):

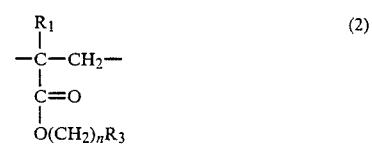

-continued

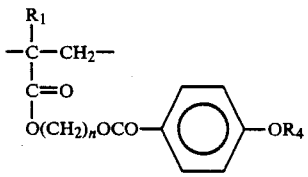 (3)

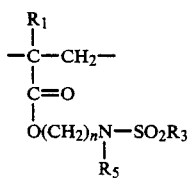 (4)

wherein

R₁ represents a hydrogen atom or a methyl group;

R₂ represents a hydrocarbon residue having from 1 to 8 carbon atoms;

R₃ represents a hydrocarbon residue having from 3 to 21 carbon atoms;

R₄ represents a perfluoroalkyl group having from 3 to 21 carbon atoms;

R₅ represents a hydrogen atom or a hydrocarbon residue having from 1 to 10 carbon atoms; and n is an integer of from 1 to 10, provided that the above recurring units (1) to (4) may be substituted by a halogen atom.

2. A photoconductive element comprising an amorphous silicon sensor capable of reading an image, comprising a glass substrate having provided thereon, in sequence, a metallic electrode, an amorphous silicon film and a transparent electrode, and a transparent, insulative protective layer on the sensor which covers the external area from the glass substrate over the sequence of the metallic electrode, the amorphous silicon film and the transparent electrode as well as connecting portions therebetween, wherein the transparent, insulative protective layer is a polymer composition composed mainly of a polymer or copolymer having a recurring unit or a mixture of units represented by formula (1), (2), (3) or (4):

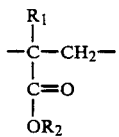 (1)

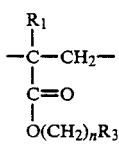 (2)

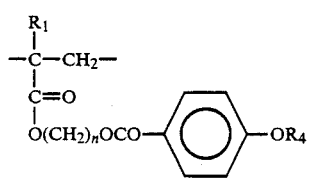 (3)

-continued

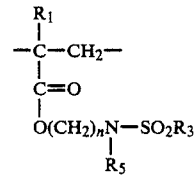 (4)

wherein R₁ represents a hydrogen atom or a methyl group;

R₂ represents a hydrocarbon residue having from 1 to 8 carbon atoms;

R₃ represents a hydrocarbon residue having from 3 to 21 carbon atoms;

R₄ represents a perfluoroalkyl group having from 3 to 21 carbon atoms;

R₅ represents a hydrogen atom or a hydrocarbon residue having from 1 to 10 carbon atoms; and n is an integer of from 1 to 10, provided that the above recurring units (1) to (4) may be substituted by a halogen atom.

3. A photoconductive element according to claim 1, wherein said metallic electrode comprises Au, Ni, Ni-Cr, Cr, Al, or Ta.

4. A photoconductive element according to claim 1, wherein said transparent electrode comprises indium tin oxide, indium oxide or tin oxide.

5. A photoconductive element according to claim 1, wherein said insulative protective layer is coated on said amorphous silicon sensor to provide a transparent layer having a thickness of from 1 to 100 mμ.

6. A photoconductive element according to claim 2, wherein said metallic electrode comprises Au, Ni, Ni-Cr, Cr, Al, or Ta.

7. A photoconductive element according to claim 2, wherein said transparent electrode comprises indium tin oxide, indium oxide or tin oxide.

8. A photoconductive element according to claim 2, wherein said insulative protective layer is coated on said amorphous silicon sensor to provide a transparent layer having a thickness of from 1 to 100 μm.

9. An amorphous silicon sensor capable of reading an image, comprising a glass substrate having provided thereon, in sequence, a metallic electrode, an amorphous silicon film and a transparent electrode, and a transparent, insulative protective layer on the sensor which covers the external area from the glass substrate over the sequence of the metallic electrode, the amorphous silicon film and the transparent electrode as well as connecting portions therebetween, wherein the insulative protective layer comprises a polymer or copolymer having a recurring unit or a mixture of units represented by formula (1), (2), (3) or (4):

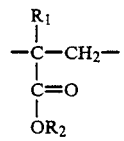 (1)

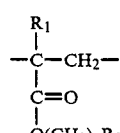 (2)

-continued

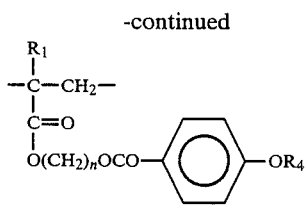

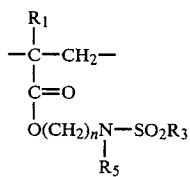

wherein $R_1$ represents a hydrogen atom or a methyl group;

$R_2$ represents a hydrocarbon residue having from 1 to 8 carbon atoms;

$R_3$ represents a hydrocarbon residue having from 3 to 21 carbon atoms;

$R_4$ represents a perfluoroalkyl group having from 3 to 21 carbon atoms;

$R_5$ represents a hydrogen atom or a hydrocarbon residue having from 1 to 10 carbon atoms; and n is an integer of from 1 to 10, provided that the above recurring units (1) to (4) may be substituted by a halogen atom.

10. An amorphous silicon sensor capable of reading an image, comprising a glass substrate having provided thereon, in sequence, a metallic electrode, an amorphous silicon film and a transparent electrode, and a transparent, insulative protective layer on the sensor which covers the external area from the glass substrate over the sequence of the metallic electrode, the amorphous silicon film and the transparent electrode as well as connecting portions therebetween, wherein the insulative protective layer is a polymer composition composed mainly of a polymer or copolymer having a recurring unit or a mixture of units represented by formula (1), (2), (3) or (4):

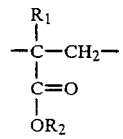

-continued

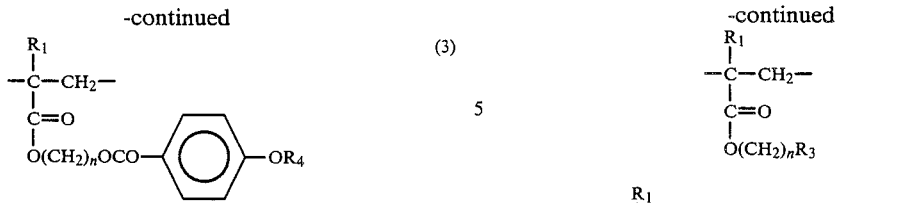

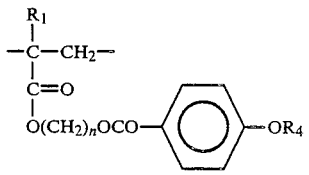

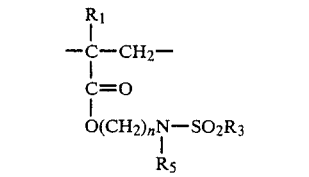

wherein $R_1$ represents a hydrogen atom or a methyl group;

$R_2$ represents a hydrocarbon residue having from 1 to 8 carbon atoms;

$R_3$ represents a hydrocarbon residue having from 3 to 21 carbon atoms;

$R_4$ represents a perfluoroalkyl group having from 3 to 21 carbon atoms;

$R_5$ represents a hydrogen atom or a hydrocarbon residue having from 1 to 10 carbon atoms; and n is an integer of from 1 to 10, provided that the above recurring units (1 ) to (4) may be substituted by a halogen atom.

11. An amorphous silicon sensor according to claim 9, wherein said metallic electrode comprises Au, Ni, Ni-Cr, Cr, Al, or Ta.

12. An amorphous silicon sensor according to claim 9, wherein said transparent electrode comprises indium tin oxide, indium oxide or tin oxide.

13. An amorphous silicon sensor according to claim 9, wherein said insulative protective layer is coated to provide a transparent layer having a thickness of from 1 to 100 m$\mu$.

14. An amorphous silicon sensor according to claim 10, wherein said metallic electrode comprises Au, Ni, Ni-Cr, Cr, Al, or Ta.

15. An amorphous silicon sensor according to claim 10, wherein said transparent electrode comprises indium tin oxide, indium oxide or tin oxide.

16. An amorphous silicon sensor according to claim 10, wherein said insulative protective layer is coated to provide a transparent layer having a thickness of from 1 to 100 m$\mu$.

* * * * *

UNITED STATES PATENT AND TRADEMARK OFFICE
CERTIFICATE OF CORRECTION

PATENT NO. : 4,973,537

DATED : November 27, 1990

INVENTOR(S) : Sadahiro TEI

It is certified that error appears in the above-identified patent and that said Letters Patent is hereby corrected as shown below:

ON TITLE PAGE: Item "[73] Assignee:", delete "Fuji Photo Film Co., Ltd., Kanagawa, Japan", and insert --Fuji Xerox Co., Ltd., Tokyo, Japan--.

Signed and Sealed this

Second Day of June, 1992

Attest:

DOUGLAS B. COMER

Attesting Officer

Acting Commissioner of Patents and Trademarks